United States Patent
Maeda (10) Patent No.: US 8,203,382 B2
(45) Date of Patent: Jun. 19, 2012

(54) AMPLIFIER CIRCUITRY

(75) Inventor: Yasushi Maeda, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 95 days.

(21) Appl. No.: 12/688,632

(22) Filed: Jan. 15, 2010

(65) Prior Publication Data

US 2010/0182083 A1    Jul. 22, 2010

(30) Foreign Application Priority Data

Jan. 22, 2009 (JP) ................... 2009-012341

(51) Int. Cl.
*H03F 3/217* (2006.01)
(52) U.S. Cl. ............ 330/251; 330/297; 330/207 A
(58) Field of Classification Search .......... 330/10, 330/251, 207 A, 297; 455/71, 142, 78, 130
See application file for complete search history.

(56) References Cited

U.S. PATENT DOCUMENTS

| 7,010,271 B2 * | 3/2006 | Melanson ............... 455/71 |
| 2004/0028242 A1 | 2/2004 | Kitamura | |

FOREIGN PATENT DOCUMENTS

JP    2001-298330 A    10/2001

OTHER PUBLICATIONS

European Search Report dated Jun. 7, 2010 in corresponding European Application No. 10151472.7.

* cited by examiner

*Primary Examiner* — Hieu Nguyen
(74) *Attorney, Agent, or Firm* — Fitzpatrick, Cella, Harper & Scinto (57) ABSTRACT

A class D amplification device that prevents beats caused by switching operations of a switching power supply and a class D amplifier from causing noise within a voice band, enables easy control over power supply operations, and offers low power loss is provided. The amplification device includes a unit that generates a reference clock, a switching power supply that operates at a first frequency at which the frequency of the reference clock is divided, and a triangular wave generation unit that operates at a second frequency higher than the first frequency at which the frequency of the reference clock is divided. The amplification device further includes a class D amplifier that performs a switching operation with a pulse whose width has been modulated according to the input signal.

14 Claims, 6 Drawing Sheets

PRIOR ART

AMPLIFIER CIRCUITRY

BACKGROUND OF THE INVENTION

1. Field of the Invention

The present invention relates to amplifier circuitry comprising a class D amplifier for use in consumer and industrial electronic equipment.

2. Description of the Related Art

A known example of class D amplifiers for use in electronic equipment is a class D amplifier that is switched and driven with a constant current conduction ratio and at the same frequency as a switching power supply is switched and driven. This class D amplifier varies a phase difference of its driving voltages depending on an input signal and thereby produces a pulse-width controlled output (see Japanese Patent Laid-Open No. 2001-298330). With such a configuration, the class D amplifier achieves a reduced size and reduces beat noise due to the difference in driving frequency between the switching power supply and the class D amplifier. To cope with such beat noise, it is possible to control a switching frequency of the class D amplifier or a switching frequency of the switching power supply for each board so as to prevent the switching frequencies of the switching power supply and the class D amplifier or beat frequencies due to harmonics from falling within the audio-frequency band.

Figure 4:
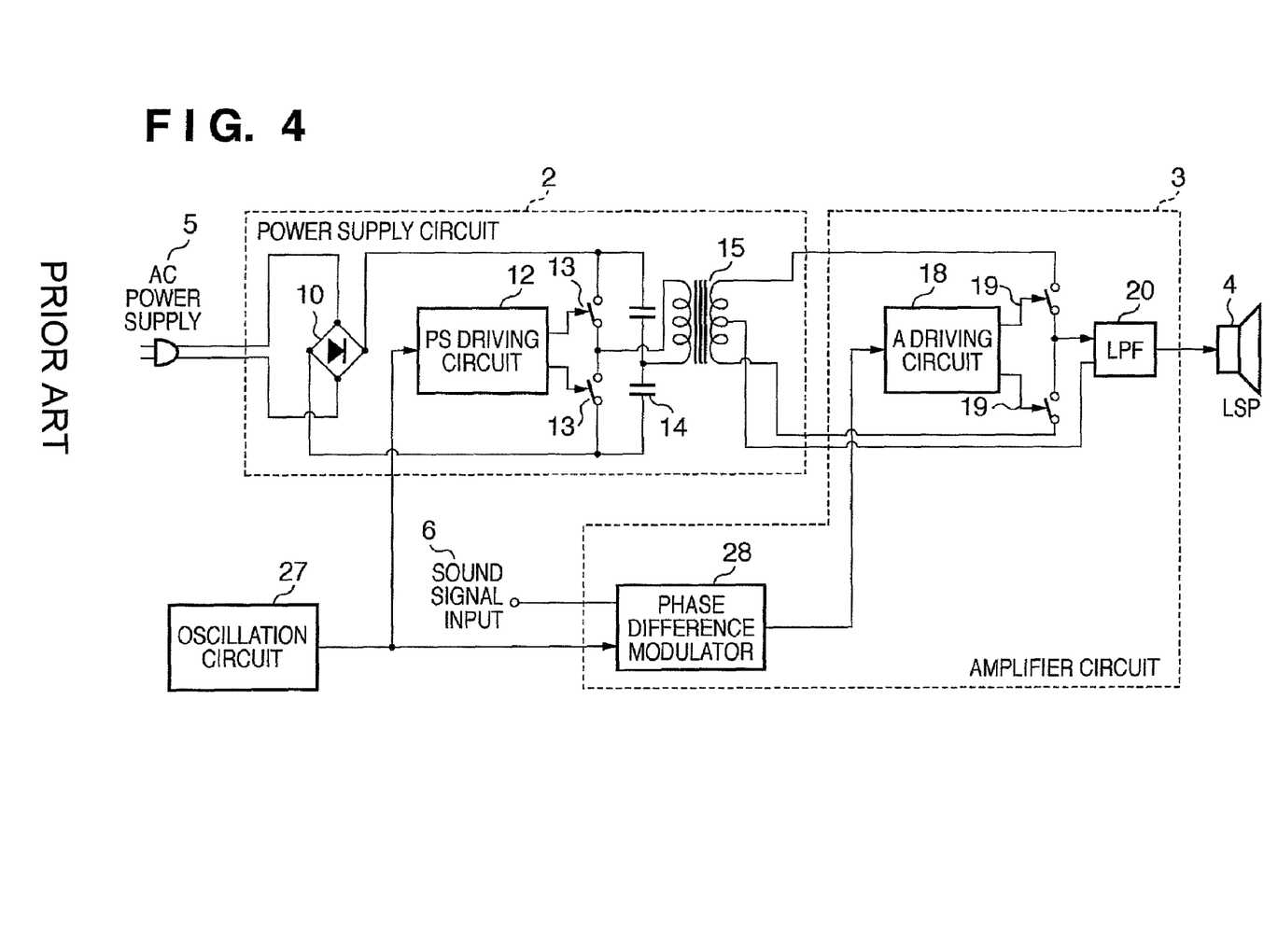
FIG. 4 is a diagram explaining a configuration of a conventional amplification device.

FIG. 4 is a block diagram illustrating a configuration of a conventional class D amplification device. A half-bridge power supply circuit 2 receives power supply from an AC power supply 5 and performs a switching operation at a duty ratio of 50% based on a clock received from an oscillation circuit 27 so as to supply a pulse voltage to an amplifier circuit 3. The amplifier circuit 3 performs a switching operation based on the clock received from the oscillation circuit 27. A phase difference modulator 28 generates pulses by changing a phase difference between the received clock and the pulse voltage received from the power supply circuit 2 depending on a sound input signal 6. The generated pulses from the phase difference modulator 28 are applied to a driving circuit 18 which performs switching in response to the pulses. As a result of this, the amplifier circuit 3 amplifies the power of the sound input signal 6 and outputs the amplified signal to a speaker 4. Since the switching operations of the switching power supply and the class D amplifier are performed at the same frequency, the class D amplification device in FIG. 4 can prevent beat noise from being caused by a difference in frequency between the switching power supply and the class D amplifier and by the harmonics of such frequencies.

With such a conventional configuration, however, there is a limit in reducing power loss because the switching power supply and the class D amplifier need to be driven at an equal driving frequency and cannot be driven at their optimum driving frequencies.

SUMMARY OF THE INVENTION

In view of this, it is desirable to provide amplifier circuitry that prevents beats caused by switching operations of a switching power supply and a class D amplifier from causing noise within an audio or voice band, enables easy control over power supply operations, and offers low power loss.

According to an aspect of the present invention, there is provided amplifier circuitry comprising: a class-D amplifier circuit that switches a power supply signal at a frequency dependent on a first clock signal; a switching power supply circuit that switches a power source signal at a frequency dependent on a second clock signal so as to generate the power supply signal; and a clock signal generating circuit that generates the first and second clock signals such that the first clock signal is higher in frequency than the second clock signal and a frequency ratio of the two clock signals is substantially constant.

Such amplifier circuitry can prevent beats caused by switching operations of the switching power supply and the class D amplifier from causing noise within an audio or voice band, enable easy control over operations to supply power to the switching power supply and the class D amplifier, and offer low power loss.

Further features of the present invention will become apparent from the following description of exemplary embodiments (with reference to the attached drawings).

DESCRIPTION OF THE EMBODIMENTS

Exemplary embodiments of the present invention are illustratively described in detail below with reference to the drawings. Note that those components described in the embodiments are only illustrative and not intended to limit the scope of the invention to the specific embodiments shown and described below.

First Embodiment

Figure 1:
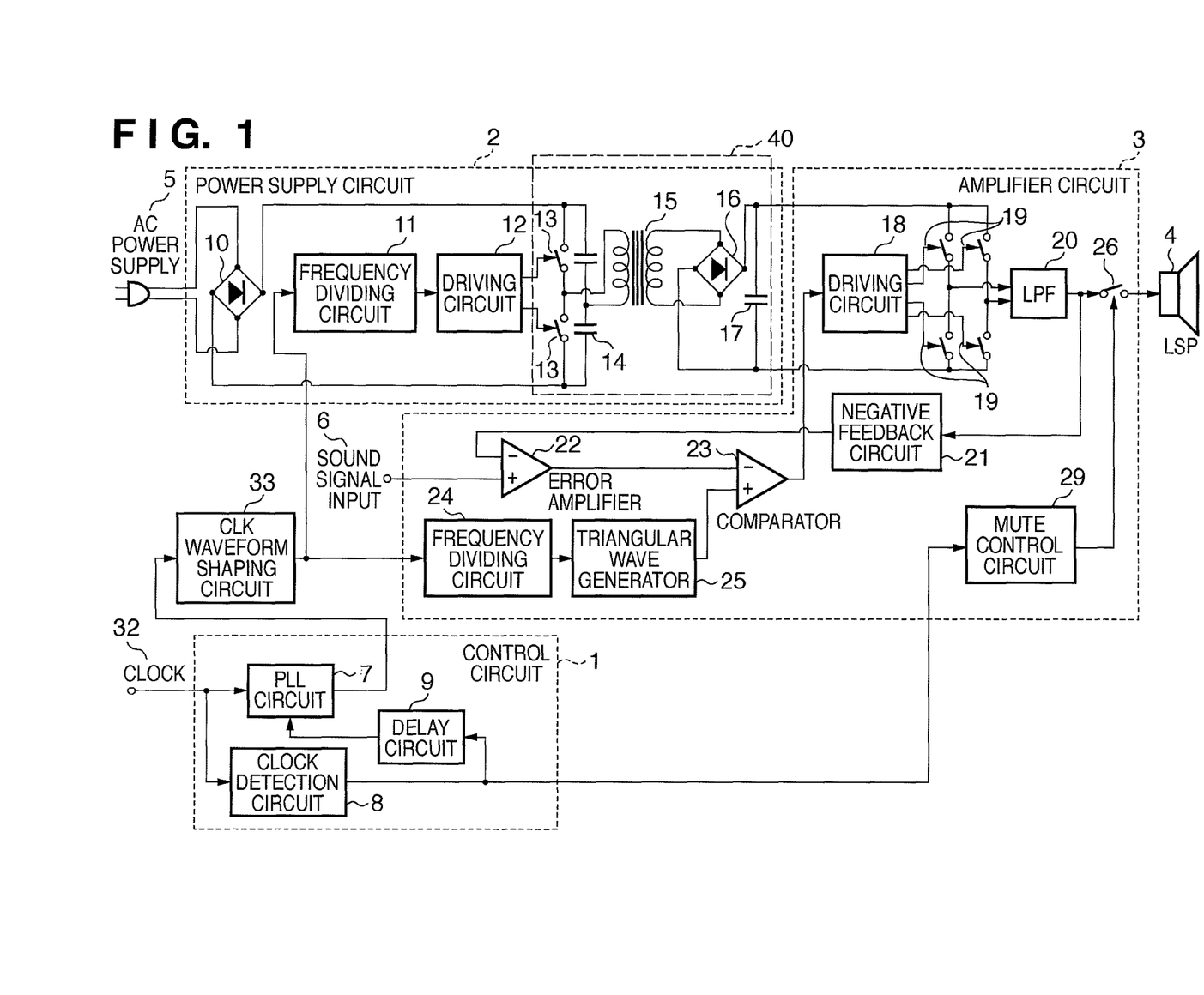
FIG. 1 is a block diagram illustrating a configuration of amplifier circuitry according to a first embodiment of the present invention.

A first embodiment of amplifier circuitry according to the present invention is described with reference to FIG. 1. Referring to FIG. 1, the amplifier circuitry comprises a control circuit 1, a switching power supply circuit 2 and a class D amplifier circuit 3.

An externally-applied clock signal 32 is input into a PLL circuit (phase-locked loop circuit) 7 and a clock detection circuit 8, which are provided in the control circuit 1.

The clock detection circuit 8 is connected to a delay circuit 9 in the control circuit 1 and to a mute control circuit 29 provided in the amplifier circuit 3. The PLL circuit 7 is under the control of the delay circuit 9 and is connected to the power supply circuit 2 and the amplifier circuit 3 via a clock (CLK) waveform shaping circuit 33. In the power supply circuit 2, an AC power supply (power source signal) 5 is input into a primary rectifier bridge 10, which is then connected to a half-bridge capacitor 14. A frequency dividing circuit 11 is connected to the clock waveform shaping circuit 33. The frequency dividing circuit 11 is connected to a driving circuit 12. The driving circuit is connected to a switching circuit 13 comprising in this embodiment a plurality of individual switching elements. The switching elements 13 and the half-bridge capacitor 14 are connected to the amplifier circuit 3 via a transformer 15, a secondary rectifier bridge 16, and a secondary smoothing capacitor 17 in this order. In the amplifier circuit 3, a LPF (low pass filter) 20 is connected to a negative feedback circuit 21 and to an error amplifier 22 via the negative feedback circuit 21. The error amplifier 22 inputs a signal from the LPF 20 and a sound input signal 6. Also in the amplifier circuit 3, a frequency dividing circuit 24 is connected to a triangular wave generator 25. The triangular wave generator 25 is connected to one input of a comparator 23. The other input of the comparator 23 is connected to the error amplifier 22. This comparator 23 is connected to a driving circuit 18. The driving circuit 18 is connected to a switching circuit 19, the LPF 20, and the output mute switch 26 in this order. The switching circuit 19 comprises a plurality of individual switching elements connected in a full-bridge configuration in this embodiment. A speaker 4 is connected to an output of the mute switch 26. The control circuit 1 and the frequency dividing circuits 24 and 11 together form a clock signal generating circuit in this embodiment. The frequency dividing circuit 24 is a first frequency dividing circuit and the frequency dividing circuit 11 is a second frequency dividing circuit.

With the above-described configuration, when the externally-applied clock signal 32 is input into the control circuit 1 from outside, the clock detection circuit 8 detects that signal as a clock signal and outputs a clock detection signal. As a result of this, the clock detection circuit 8 enables the mute control circuit 29 and causes the PLL circuit 7 via the delay circuit 9 to start a phase synchronization operation. Thereafter, with the mute control circuit 29 being in the enabled state, the power supply circuit 2 and the amplifier circuit 3 start their operations, entering electrically stable states. After a further lapse of a predetermined period of time, the mute control circuit 29 turns the output mute switch 26 on. Also, when the externally-applied clock signal 32 is input, the delay circuit 9 actuates the PLL circuit 7 with some amount of time delay upon receipt of the clock detection signal from the clock detection circuit 8.

Clock pulses in a clock (reference signal) output from the PLL circuit 7 are converted into shaped pulses by the clock waveform shaping circuit 33. The waveform shaping circuit 33 performs a waveform shaping operation on the reference-signal pulses and the shaped pulses are then input into the frequency dividing circuit 11 (second frequency dividing circuit) in the power supply circuit 2. The frequency of the reference-signal pulses is divided so as to obtain a power supply clock signal (second clock signal) having a desirable or optimum frequency for the switching power supply (power supply circuit 2). Since the reference signal output from the PLL circuit 7 is subjected to the waveform shaping operation by the clock waveform shaping circuit 33, it may contain a small number of harmonics and may be of a small signal level; it may be a sine wave, which is more desirable.

In the power supply circuit 2, the switching elements in the switching circuit 13, the half-bridge capacitor 14, the transformer 15, the secondary rectifier bridge 16, and the secondary smoothing capacitor 17 constitute a half-bridge switching power supply 40. The switching elements in the switching circuit 13 may generally be a MOSFET, an IGBT, or the like. The power supply circuit 2 uses the half-bridge capacitor 14 to smooth a voltage that has been obtained by rectifying the input AC power supply 5 with the primary rectifier bridge 10. Thus, the power supply circuit 2 supplies a DC voltage to the half-bridge switching power supply 40.

The driving circuit 12 performs a switching operation at a duty ratio of 50% based on the second clock signal generated by the frequency dividing circuit 11 and supplies a DC voltage (power supply signal) to the amplifier circuit 3 across the terminals of the secondary smoothing capacitor 17. Meanwhile, the shaped pulses of the reference signal output from the clock waveform shaping circuit 33 are input into the frequency dividing circuit 24 (first frequency dividing circuit) in the amplifier circuit 3, and the frequency dividing circuit 24 generates a first clock signal having a desirable or optimum frequency for the amplifier circuit 3 (class D amplifier circuit) through frequency division.

A difference between the sound input signal 6 and an output signal of the amplifier circuit that has been fed back through the negative feedback circuit 21 is amplified by the error amplifier 22 to generate an error signal which is input into one input of the comparator 23. The comparator 23 compares the input error signal and a triangular wave that has been generated by the triangular wave generator 25 based on the first clock signal output from the frequency dividing circuit 24. The comparator 23 thus serves as a pulse-width modulation unit that outputs a PWM pulse based on the error signal received from the error amplifier 22.

The driving circuit 18 drives the switching elements in the switching circuit 19 based on the output from the comparator 23 and thereby switches the power supply signal received from the power supply circuit 2. This produces, after low-pass-filtering by the LPF 20, an output suitable for driving the speaker 4. The switching element 19 may generally be an MOSFET or the like. Since the LPF 20 removes the fundamental frequency and harmonic components included in the output of the switching element 19, an output signal only within an audio-frequency band is supplied to the speaker 4 via the output mute switch 26. If the externally-applied clock signal 32 stops being input into the PLL circuit 7, the clock detection circuit 8 stops supplying the clock detection signal to the mute control circuit 29. As a result, the mute control circuit 29 determines that the sound output from the speaker 4 should be muted, and then immediately turns the output mute switch 26 off.

When the clock detection signal stops the delay circuit 9 transmits a control signal to the PLL circuit 7 so that the PLL circuit 7 is stopped after a prescribed period of time. As a result of this, the supply of the reference signal to the power supply circuit 2 and the amplifier circuit 3 is stopped, under which condition the power supply circuit 2 is brought to a standby state and the amplifier circuit 3 to a stopped state.

The frequency $f_{ps}$ of the clock for the switching power supply (power supply circuit 2) is selected depending on product specifications, such as power loss and shape, or depending on costs; generally, a frequency of approximately 100 kHz is selected. The frequency $f_{amp}$ of the clock required for the class D amplifier circuit (amplifier circuit 3), on the other hand, depends on the input and output frequency characteristics of the amplifier circuit; it is preferably approximately 20 times the maximum frequency handled by the amplifier circuit. In the case where the maximum frequency in the audio band is 20 kHz, a clock frequency $f_{amp}$ of approximately 400 kHz is necessary; and in the case where the amplifier circuit is intended for only a restricted audio band (low voice band) and the maximum frequency is approximately 10 kHz, a clock frequency $f_{amp}$ of approximately 200 kHz is sufficient enough.

From this, the relationship between a clock frequency $f_{ps}$ for the switching power supply circuit (power supply circuit 2) and a clock frequency $f_{amp}$ for the class D amplifier circuit (amplifier circuit 3) is $f_{ps} \leq f_{amp}$. In this embodiment, both clock frequencies are generated by dividing the frequency of a common reference signal. If a precisely 50-percent duty ratio is required for the clock signal (first clock signal) used in the class D amplifier circuit, a frequency $f_o$ of the reference signal is preferably two times (or 2i times, where i is an integer) the clock frequency famp, so that a divide-by-two circuit can be used to generate the first clock signal by frequency division of the reference signal or of a signal derived therefrom. Also, in this embodiment, those frequencies must be in such a relationship that enables clock generation through frequency division. The relationships between the frequencies in the present embodiment are thus as follows: $f_{ps} \leq f_{amp}$ and $2 \times f_{amp} \leq f_o$. Moreover, the differences in frequency between the fundamental frequency and the harmonics of the clock for the switching power supply and the fundamental frequency and the harmonics of the clock for the class D amplifier circuit are set so as not to be frequencies within the audio-frequency band. The frequency dividing circuits 11 and 24 are thus set to have a frequency division ratio that is necessary for obtaining the above-mentioned frequencies.

Of course, if the reference signal itself has a 50-percent duty ratio, and has a suitable frequency, then it can be used directly, with or without shaping by the waveform shaping circuit, to provide the first clock signal. In that case, the first frequency dividing circuit 24 is not required.

In the present embodiment, the reference signal is generated by the PLL circuit 7 so that the reference signal is locked in phase and frequency to the externally-applied clock signal 32. As noted previously, the reference signal could be of the same frequency as the externally-applied clock signal or it could be higher or lower in frequency than the externally-applied clock signal. If the PLL circuit 7 comprises a divide-by-two circuit (for example, because the externally-applied clock signal frequency is 2 or 2i times the reference signal frequency) then the reference signal will have a 50-percent duty ratio and can be used directly, with or without shaping by the waveform shaping circuit, to provide the first clock signal.

In this embodiment, because the first and second clock signals are generated from a common reference signal, each of them has a substantially fixed frequency ratio to the common reference signal. It follows that a frequency ratio of the two clock signals is substantially constant. Thus, even if the common reference signal varies in frequency the frequency ratio of the two clock signals is substantially constant. Of course, the same result can be achieved by generating a reference signal usable directly, with or without waveform shaping, as the first clock signal and then dividing the reference signal by a suitable frequency division circuit to generate the second clock signal.

Note that the triangular wave generated by the triangular-wave generator is not limited to a perfect triangular wave; the waveform may be of any triangular shape, such as a sawtooth waveform, for example.

As described above, the present embodiment provides a class D amplification device that prevents beats caused by switching operations of the switching power supply and the class D amplifier from causing noise within a voice band. The class D amplification device also enables easy control over power supply operations, offers low power loss, and reduces radiant noise.

Second Embodiment

Figure 2:
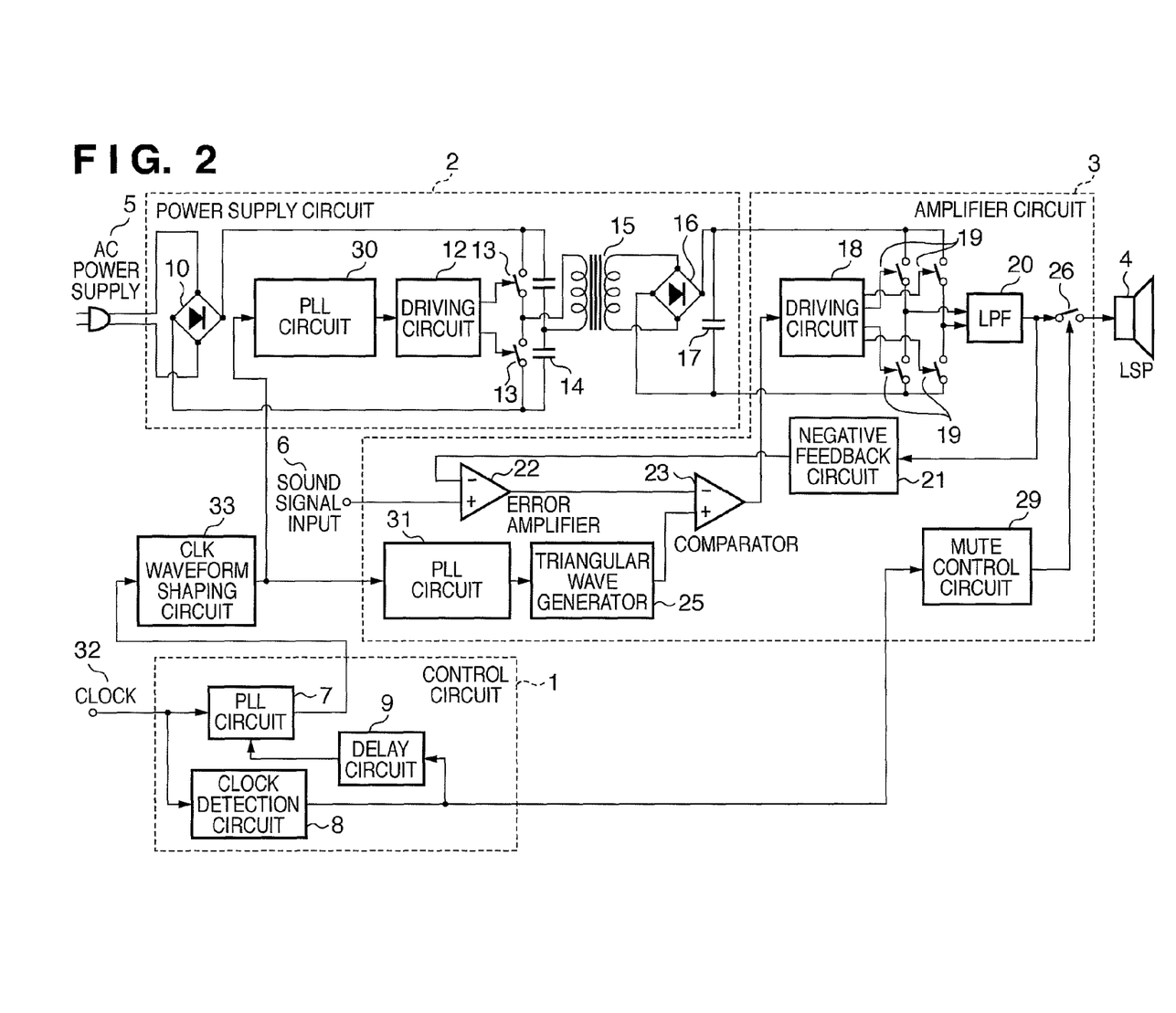
FIG. 2 is a block diagram illustrating a configuration of amplifier circuitry according to a second embodiment of the present invention.

A second embodiment of the present invention is described next with reference to FIG. 2. A feature of the second embodiment is that the frequency dividing circuits 11 and 24 in the first embodiment are replaced with PLL circuits 30 and 31 respectively. Note that the other components of the configuration and their operations are identical to those described in the first embodiment, so that identical components are denoted by the same reference numerals and their description is omitted herein.

In the configuration of the present embodiment, the switching power supply (power supply circuit 2) and the class D amplifier circuit (amplifier circuit 3) generate the clock signals that they use by their own PLL circuits, so that each PLL circuit is configured to multiply or divide the frequency of the reference signal supplied by the waveform shaping circuit as necessary. The control circuit 1 and the PLL circuits 31 and 30 together form a clock signal generating circuit in this embodiment. The PLL circuit 31 is a first PLL circuit and the PLL circuit 30 is a second PLL circuit.

Note that the PLL circuit 30 in the power supply circuit 2 and the PLL circuit 31 in the amplifier circuit 3 may not necessarily be separate circuits; alternatively, a common PLL circuit may be used to generate, by frequency multiplication and/or division, the first and second clock signals having frequencies required for the switching power supply and the class D amplifier circuit.

As described above, the present embodiment provides a class D amplification device that prevents beats caused by switching operations of the switching power supply and the class D amplifier from causing noise within an audio or voice band. The class D amplification device also enables easy control over power supply operations and reduces power loss. The class D amplification device according to the present embodiment further allows the frequency of the supplied externally-applied clock signal (from which the reference signal is derived) to be lower than the frequencies necessary for the switching power supply and the class D amplifier circuit, thus having the effect of further reducing radiant noise caused by a reference-clock supply line.

Third Embodiment

A third embodiment of the present invention is described next with reference to FIGS. 3A, 3B and 3C. A feature of the third embodiment is that a plurality of (in this example, 3) switching power supply circuits 2a, 2b and 2c are provided, and a plurality of class D amplifier circuits 3a, 3b and 3c are provided. Each switching power supply circuit 2a, 2b and 2c is of identical configuration and operation to the switching power supply circuit 2 in the first embodiment. Each amplifier circuit 3a, 3b and 3c is of identical configuration and operation to the amplifier circuit 3 in the first embodiment. Identical components are denoted by the same reference numerals and their description is omitted herein. The control circuit 1 is provided in common for all the switching power supply circuits 2a, 2b and 2c and the class D amplifier circuits 3a, 3b and 3c.

Each amplifier circuit 3a, 3b, 3c switches a power supply signal of its corresponding switching power supply circuit 2a, 2b, 2c at a frequency dependent on such a first clock signal $f_{amp}$. Each switching power supply circuit 2a, 2b, 2c switches a power source signal 5 at a frequency dependent on such a second clock signal $f_{ps}$ so as to generate the power supply signal of the switching power supply circuit concerned.

In this embodiment the clock signal generating circuit comprises the control circuit 1 and, in addition, one such first frequency dividing circuit 11 is provided per amplifier circuit 3a, 3b and 3c and one such second frequency dividing circuit 24 is provided per switching power supply circuit 2a, 2b and 2c. Accordingly, for said class-D amplifier circuit 3a, 3b and 3c and its corresponding switching power supply circuit 2a, 2b and 2c, the clock signal generating circuit of the third embodiment generates first and second clock signals $f_{amp}$, $f_{ps}$ such that the first clock signal $f_{amp}$ is higher in frequency than the second clock signal $f_{ps}$ and a frequency ratio of the two clock signals is substantially constant.

At least one first clock signal may be different in frequency from another first clock signal. Similarly, at least one second clock signal may be different in frequency from another second clock signal. In this way, the clock signals can be set to desirable or optimum frequencies for the individual power supply and amplifier circuits 2a-2c and 3a-3c even if the characteristics of those circuits differ.

Of course, each power supply circuit 2a-2c can be constituted as in the second embodiment and/or each amplifier circuit 3a-3c can be constituted as in the second embodiment.

Figure 3A:
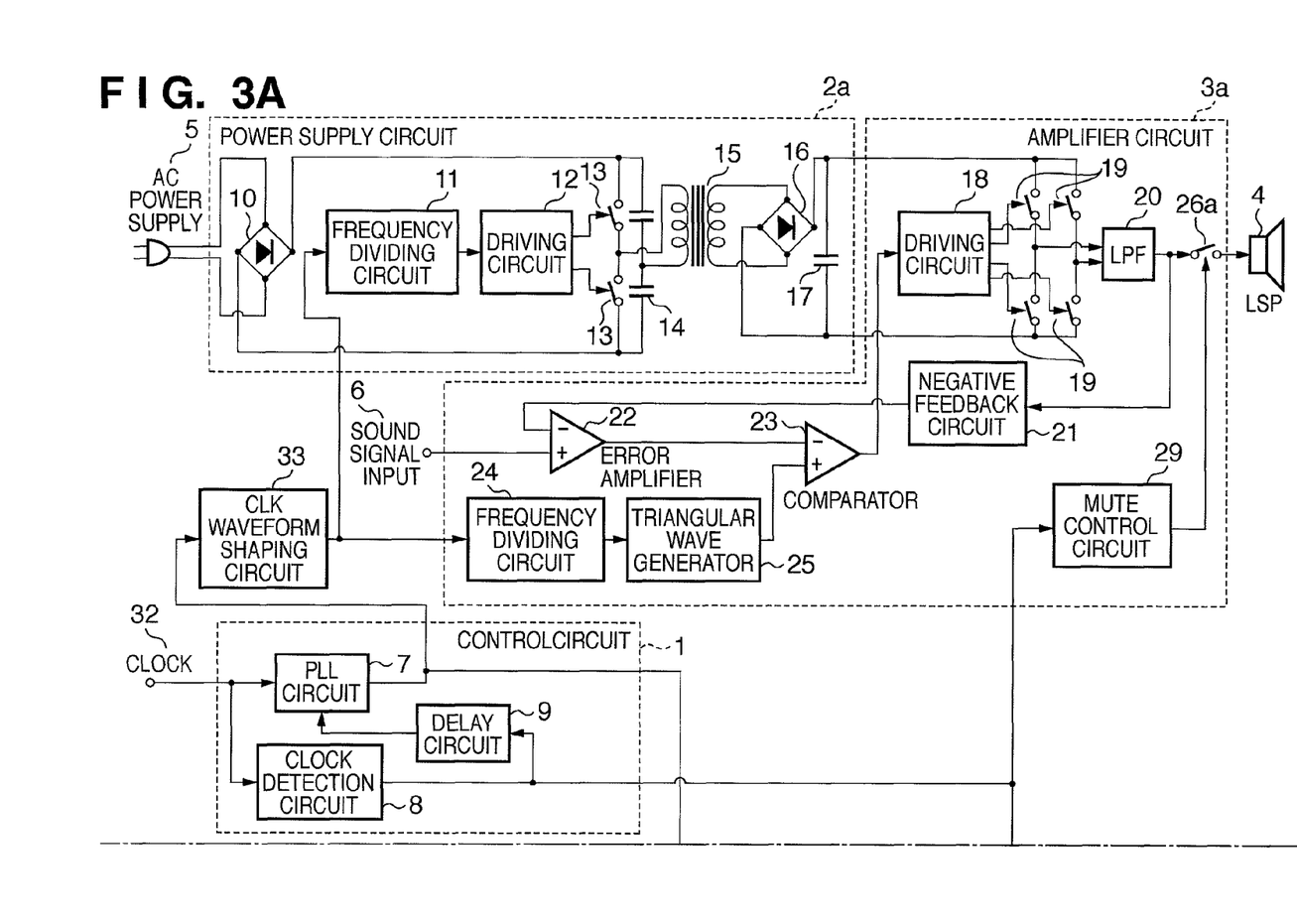
FIGS. 3A, 3B and 3C are block diagrams illustrating a configuration of amplifier circuitry according to a third embodiment of the present invention.
Figure 3B:
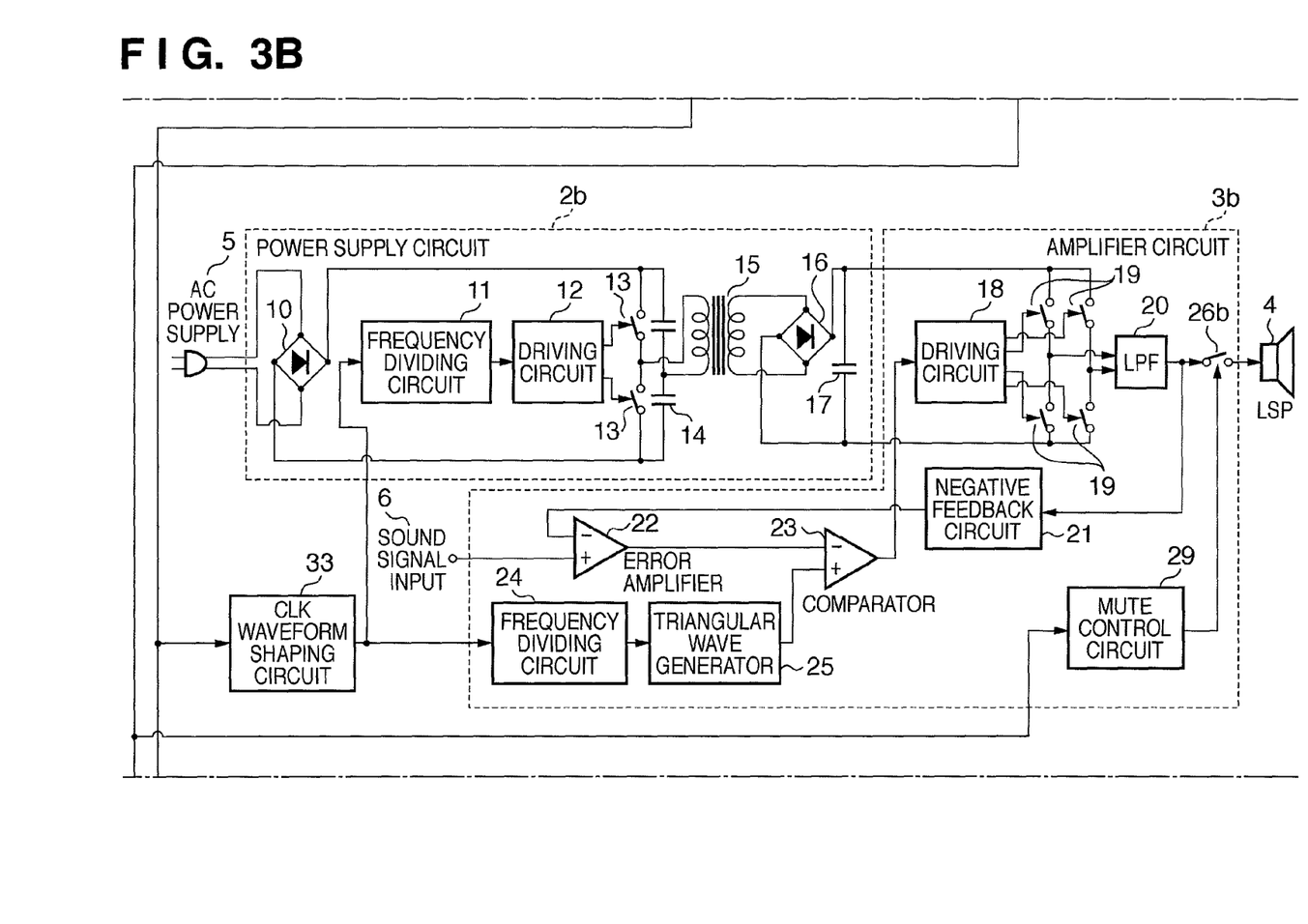
Figure 3C:
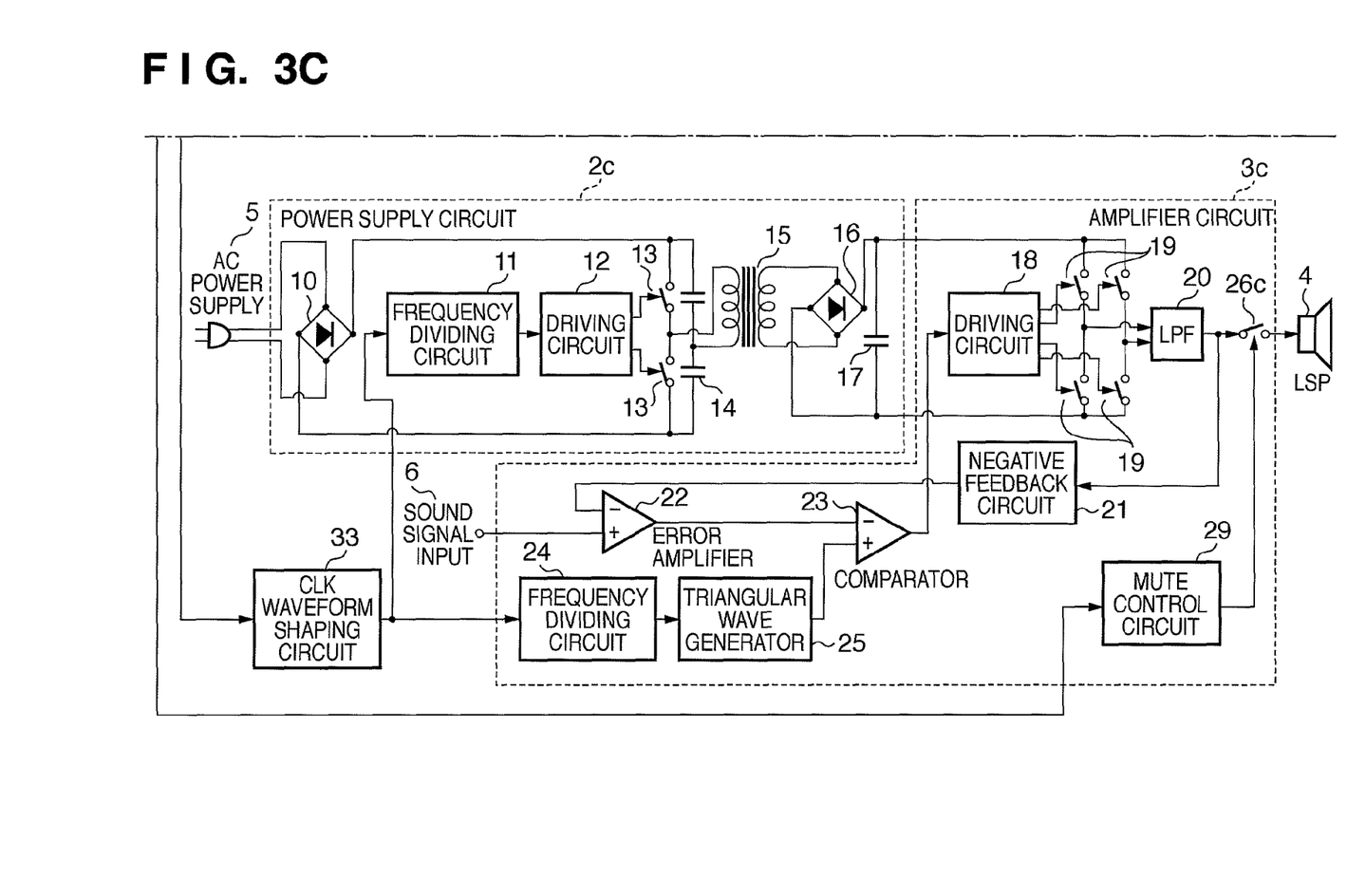

Although individual power source signals 5 are shown for each power supply circuit 2a-2c in FIGS. 3A-3C, of course a single power supply signal can be applied to all the power supply circuits 2a-2c.

As described above, the present embodiment provides a class D amplification device that prevents beats caused by switching operations of the switching power supply and the class D amplifier from causing noise within a voice band. The class D amplification device also enables easy control over power supply operations, offers low power loss, and reduces radiant noise. The class D amplification device according to the present embodiment further allows selective control over power supply operations by supplying a reference clock from the control circuit to a specific power supply circuit and a specific amplifier circuit.

Other Embodiments

While the embodiments of the present invention have been described so far in detail, the present invention may be applied to a system constituted from a plurality of devices or to an apparatus composed of a single device. For example, amplifier circuitry embodying the present invention may be formed as an integrated circuit (IC) device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-012341 filed Jan. 22, 2009, which is hereby incorporated by reference herein in its entirety.

What is claimed is:

1. Amplifier circuitry comprising:
a class-D amplifier circuit that switches a power supply signal at a frequency dependent on a first clock signal;
a switching power supply circuit that switches a power source signal at a frequency dependent on a second clock signal so as to generate said power supply signal;
a clock signal generating circuit that generates said first and second clock signals such that the first clock signal is higher in frequency than the second clock signal and a frequency ratio of the two clock signals is substantially constant, and
a waveform shaping circuit for shaping a waveform of one or each of said first and second clock signals so as to reduce harmonics therein.

2. Amplifier circuitry according to claim 1, wherein said clock signal generating circuit derives said first and second clock signals from a common reference signal different in frequency from at least one of said first and second clock signals.

3. Amplifier circuitry according to claim 2, wherein the differences between the frequency of one or each of said first and second clock signals and frequencies of harmonics of such clock signal are outside an audio-frequency band.

4. Amplifier circuitry according to claim 2, wherein the reference signal is higher in frequency than at least said second clock signal, and said clock signal generating circuit comprises at least one frequency dividing circuit for generating the second clock signal by frequency-division of the reference signal or of a signal derived therefrom.

5. Amplifier circuitry according to claim 4, wherein the reference signal is higher in frequency than each of said first and second clock signals, and said clock signal generating circuit comprises first and second frequency dividing circuits for generating the first and second clock signals respectively, each said frequency dividing circuit generating its said clock signal by frequency-division of the reference signal or a signal derived therefrom.

6. Amplifier circuitry according to claim 2, wherein the reference signal is lower in frequency than at least said first clock signal, and said clock signal generating circuit comprises at least one PLL circuit for generating the first clock signal by performing a PLL operation on the reference signal or a signal derived therefrom.

7. Amplifier circuitry according to claim 6, wherein the reference signal is lower in frequency than each of said first and second clock signals, and said clock signal generating circuit comprises first and second PLL circuits for generating the first and second clock signals respectively, each said PLL circuit generating its said clock signal by performing a PLL operation on the reference signal or a signal derived therefrom.

8. Amplifier circuitry according to claim 2, wherein the reference signal is or is derived from an externally-applied signal.

9. Amplifier circuitry according to claim 8, further comprising a PLL circuit connected for receiving the externally-applied signal and for generating the reference signal by performing a PLL operation on the externally-applied signal.

10. Amplifier circuitry according to claim 1, wherein said waveform shaping circuit shapes one or each of said first and second clock signals to have a sine-wave shape.

11. Amplifier circuitry according to claim 1, wherein the amplifier circuit comprises:
a triangular wave generation unit that generates a triangular wave based on the first clock;
a pulse-width modulation unit that performs pulse-width modulation on an input signal, using the triangular wave generated by the triangular wave generation unit; and
an output unit that outputs a voltage from the switching power supply circuit by switching, in response to a signal output from the pulse-width modulation unit.

12. Amplifier circuitry according to claim 9, further comprising:
a detection unit that detects the externally-applied signal and outputs a detection signal indicating that the externally-applied signal has been detected; and
a delay unit that delays the detection signal so as to control the PLL operation of the PLL circuit using the delayed detection signal.

13. Amplifier circuitry according to claim 11, further comprising:
an error output unit that outputs an error between the input signal and an output signal from the output unit,
wherein the pulse-width modulation unit performs the pulse-width modulation in response to an output from the error output unit.

14. Amplifier circuitry according to claim 1, comprising a plurality of such class-D amplifier circuits and a plurality of such switching power supply circuits corresponding respectively to the amplifier circuits;

wherein each said amplifier circuit that switches a power supply signal of its corresponding switching power supply circuit at a frequency dependent on such a first clock signal;

each said switching power supply circuit switches a power source signal at a frequency dependent on such a second clock signal so as to generate said power supply signal of the switching power supply circuit concerned; and said clock signal generating circuit, for each said class-D amplifier circuit and its said corresponding switching power supply circuit, generates said first and second clock signals such that the first clock signal is higher in frequency than the second clock signal and a frequency ratio of the two clock signals is substantially constant.

* * * * *